United States Patent

[11] 3,581,233

[72] Inventors Akio Yamashita
Ikeda-shi;
Takehiro Tuzaki, Toyonaka-shi, both of, Japan
[21] Appl. No. 847,684
[22] Filed Aug. 5, 1969
[45] Patented May 25, 1971
[73] Assignee Matsushita Electric Industrial Co., Ltd. Osaka, Japan
[32] Priority July 8, 1966, July 21, 1966, July 21, 1966, July 21, 1966, July 29, 1966
[33] Japan
[31] 41/44973, 41/48265, 41/48266, 41/48267 and 41/50886
Continuation-in-part of application Ser. No. 651,278, July 5, 1967, now abandoned.

[54] SOLID-STATE OSCILLATOR ELEMENT
5 Claims, 4 Drawing Figs.

[52] U.S. Cl. .......... 331/107, 317/234
[51] Int. Cl. .......... H03b 7/14
[50] Field of Search .......... 331/107; 317/234

[56] References Cited
OTHER REFERENCES

Applied Physics Letters, " Microwave Oscillations" by Allen et al., Vol. 7, No. 4 Pages 78— 80 Aug. 15, 1965 331-107G IEEE Trans. on Electron Devices, " Microwave Oscillations in Epitaxial Layers of GaAs," Hasty et al., Jan. 1966 Vol Ed-13, No. 1, Pgs 114— 116 copy in GR252

*Primary Examiner*—John Kominski
*Attorney*—Stevens, Davis, Miller and Mosher

ABSTRACT: A solid-state oscillator element formed of a thin film of a polycrystalline semiconductor of which the minimum value of the conduction band represents a different energy level depending upon the direction in the wave vector space (usually referred to as "k-space"). Thus, the solid-state oscillator element is capable of producing a microwave oscillation.

A. YAMASHITA AND
T. TUZAKI
INVENTORS

BY Stevens, Davis, Miller & Mosher
ATTORNEYS

SOLID-STATE OSCILLATOR ELEMENT

CROSS-REFERENCES TO RELATED APPLICATIONS

The present application is a continuation-in-part application of an earlier Application Ser. No. 651,278 filed July 5, 1967, now abandoned.

BACKGROUND OF THE INVENTION

1. Field of the Invention

This invention relates to a solid-state oscillator element which is adapted for producing a microwave oscillation, and which is formed of a thin film of polycrystalline semiconductor in which the minimum energy of the conduction band varies depending upon direction in a wave number vector space (usually referred to as "*k-space*").

2. Description of the Prior Art

In the past such solid-state elements capable of producing a microwave oscillation used a single crystal semiconductor such as GaAs, Si, Ge, InSb or the like. This increased the cost of manufacturing such elements. In addition, since the minimum possible thickness of such a single crystal is limited to at best several 10 microns, the heat dissipation of the element is poor. This makes it difficult for such elements to produce a continuous high power oscillation. This also makes it necessary to use cooling means for this purpose. Furthermore, the frequency of oscillation obtainable is at best of the order of 10 gc./s.

SUMMARY OF THE INVENTION

Accordingly, a primary object of this invention is to overcome such disadvantages and limitations existing in the conventional solid-state oscillator elements.

Another object of this invention is to provide a novel solid-state oscillator element which is adapted for producing a microwave oscillation, and which is formed of a thin film of a semiconductor polycrystal in which the minimum energy of the conduction band varies depending upon direction in the *k*-space.

GaAs, GaSb and the like are known as semiconductor materials in which the minimum energy of the conduction band varies depending upon direction in the *k*-space. Polycrystalline thin films of these semiconductors can be obtained by various methods such as, for example, vacuum evaporation, vapor phase reaction, liquid phase reaction of the like. The vacuum evaporation technique includes the method in which the constituent atoms of a semiconductor are sputtered in a vacuum to form a semiconductor film on a substrate, and the method in which a semiconductor is evaporated in a vacuum to form a polycrystalline thin film on a substrate. The vapor phase reaction method is one in which a semiconductor is vaporized to be carried together with a gas having a catalytic action onto a substrate so as to form a polycrystalline thin film. The liquid phase reaction method is one in which a semiconductor in the liquid phase is formed into a polycrystalline film on a substrate.

The substrate used in these methods may be any material which acts as an electrode, and such material includes metal and other conductive substances.

DESCRIPTION OF THE PREFERRED EMBODIMENTS

Figure 1:
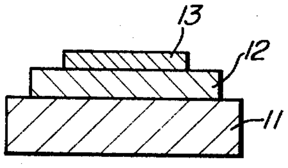
FIG. 1 is a cross-sectional view of an example of the simplest structure of the solid-state oscillator element according to the present invention.

Referring now to FIG. 1, there is shown an example of the simplest structure of the solid-state oscillator element according to the present invention. This solid-state oscillator element includes an electrode substrate 11, a thin film 12 of a polycrystalline semiconductor in which the minimum energy in the conduction band represents a different energy level depending upon direction in the *k*-space, and an electrode 13.

A method of fabricating the polycrystalline thin film 12 will first be described with reference to a GaAs polycrystalline thin film by way of an example. A GaAs film is fabricated by vacuum deposition with three point temperature method. Ga and As are deposited on an electrolytically polished Ta plate from separate Ga and As sources. When the temperature of the Ga source is less than about 450° C., the deposited film is amorphous irrespective of the temperature of the As source. When the temperature of the Ga source is higher than about 750° C., the GaAs polycrystalline thin film can easily b formed. As the temperature of the As source is raised, this tendency is enhanced.

Figure 2:
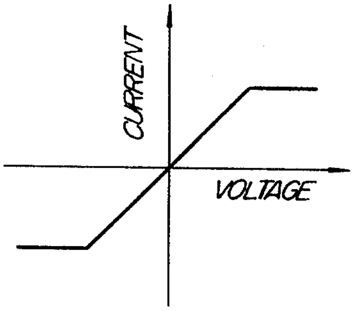
FIG. 2 is a graph of the current-voltage characteristics of the element shown in FIG. 1.

Assuming now that an electric field of about $10^3$ to $10^4$ V/cm. is applied between said two electrodes, electrons present in the conduction band of the lower minimum energy in the energy level are excited to the conduction band of the higher minimum energy. The electrons in the conduction band of the lower energy level have a higher mobility and a smaller effective mass, while the electrons in the conduction band of the higher energy level have a lower mobility and a greater effective mass. Therefore, the current-voltage characteristic of the element is such, as shown in FIG. 2, that the resistance is increased at a certain voltage value, with the result that a current saturation phenomenon occurs. By further increasing the field the element produces a microwave oscillation. In this way, the use of a polycrystalline thin film makes it possible to produce an oscillation frequency of several 10 gc./s to several 100 gc./s. No microwave oscillation of such a high frequency has been obtained by any conventional solid-state element. In addition, according to the present invention, such oscillation can be produced at room temperature without using cooling means.

Such microwave oscillation may occur because the electrons are excited by the applied field to locally form a region of a high resistance which in turn shifts in the polycrystalline thin film or because the region is which the electrons are made into hot electrons by the field shifts in the said film. However, this is not clearly known.

Figure 3:
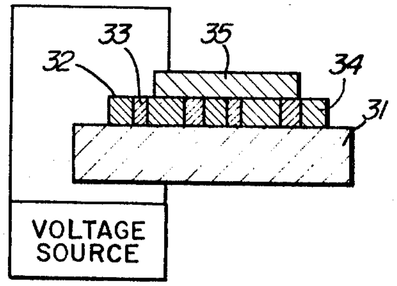
FIG. 3 is a cross-sectional view of an example of the simplest structure of the solid-state oscillator element using a polycrystalline thin film to produce more efficient microwave oscillation.

In FIG. 3 there is shown the simplest structure of the solid-state oscillator element using a polycrystalline thin film to produce microwave oscillations with a higher efficiency.

Through their research, the inventors have found 70 if use is made of a polycrystalline thin film having regions oriented in substantially the same direction (the axis of orientation of which is usually the <III>axis) as the direction of the film thickness of the polycrystalline thin film 12 shown in FIG. 1, microwave oscillation can be produced even more efficiently. The solid-state oscillator element shown in FIG. 3 comprises an electrode substrate 31, a thin film 32 of a polycrystalline semiconductor in which the minimum energy of the conduction band varies depending upon direction in the *k*-space, regions 33 oriented in said polycrystalline film in the same direction as the direction of thickness thereof, regions 34 which are not oriented in the same direction as the film thickness, and an electrode 35.

It has been found by the inventors that such regions oriented in the polycrystalline thin film in the same direction as the film thickness can be provided by raising the temperature of the sources during the formation of the film and making the film thin.

If an electric field of about $10^3$ V/cm. to $10^4$ V/cm, is applied between said two electrodes 31 and 35, the electrons in the region 33 is excited as previously described. The current-voltage characteristic in this case is such as shown in FIG. 2, that is, the resistance is increased when a certain voltage is applied, with the result that a current saturation phenomenon occurs. Further increase of the field causes a microwave oscillation be produced.

On the other hand, in the regions 34 which are not oriented in the same axial direction as the film thickness the loss of energy is so great that such phenomenon can hardly occur. Thus, the efficiency of microwave oscillation is raised by providing regions 33 oriented in the same axial direction as the film thickness at least in a portion of the operating region of the polycrystalline thin film.

Description will now be made of the solid-state oscillator element according to an embodiment of this invention.

Ga and As of 99.9999 percent purity are heated in a vacuum of $10^{15}$ Torr. in separate crucibles and evaporated therefrom onto an electropolished metal substrate of Ta to form a film of gallium arsenide thereon. In this case, when the temperature of the Ga source reaches 1500° C. or higher, at least there are formed regions which are oriented in the same axial direction as that of the film thickness.

The resistivity, thickness and composition of the film of gallium arsenide may be varied according to the evaporating velocity, the temperature of the Ga source and As source and the evaporating time. The inventors have found that if the composition ratio (Ga/As), i.e., the ratio of the number of Ga atoms to the number of As atoms in the gallium arsenide film is in the range of 0.2 to 3.0 and the resistivity is $10^5$ Ωcm. or less, there is obtained a good oscillator element. An Au electrode is evaporated in a vacuum onto the thus formed polycrystalline film of gallium arsenide, and thereafter the film is placed in a cavity resonator and a voltage is applied thereto to produce a microwave oscillation of several 10 gc./s to several 100 gc./s, although this range varies depending on the film thickness and resistivity.

Next, GaAs, Ta substrate and small quantities of gallium chloride and gallium oxide are introduced into a silica tube at a pressure of $10^{15}$ Torr and left therein with a temperature gradient. Then, a polycrystalline film of gallium arsenide doped with oxygen is formed. The oxygen diffused into the gallium arsenide film forms a deep level in the forbidden band of the gallium arsenide. This film also is a polycrystalline film, and it is possible to generate microwave oscillation by applying the above-mentioned procedure thereto. The field necessary to cause such microwave oscillation becomes smaller when a deep-level-forming impurity is present. A similar effect to that of oxygen can also be obtained by using gold as the deep-level-forming impurity.

Figure 4:
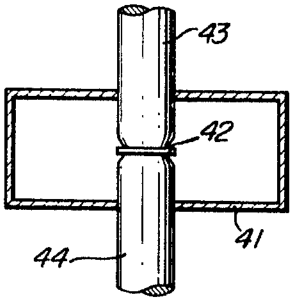
FIG. 4 is a schematic diagram showing an element placed in a cavity resonator.

FIG. 4 shows the solid-state oscillator element as it is placed in the cavity resonator, wherein the numeral 41 designates a cavity resonator, 42 said solid-state oscillator element, and 43 and 44 electrodes which also serve as support means.

Use of such oscillator element makes it possible to produce a continuous oscillation at room temperature.

While description has been made only of the polycrystalline gallium arsenide film, similar results have been obtained with other semiconductors. Also, the substrate in use may be Ta, Mo, $SNO_2$ or the like and one of the electrodes may be Au, Al, Sn or the like.

It is not necessarily required that the regions 33 which are herein referred to as the region oriented in the same axial direction be a single crystal, but they may be polycrystalline if they are uniform in the axial direction. As has been described above in detail, the solid-state oscillator element according to the present invention can produce a high power microwave oscillation of a very high frequency, and the ease in the formation of the polycrystalline film and the low cost of the manufacture give the present invention a great industrial utility.

We claim:

1. A solid-state oscillator element, comprising a thin film of a polycrystalline semiconductor in which the minimum energy of the conduction band varies depending upon direction in a wave number vector space, an electrode substrate having said thin film formed thereon, and an electrode provided on said thin film of the polycrystalline semiconductor, wherein a voltage is applied between said electrodes to produce a microwave oscillation.

2. A solid-state oscillator element according to claim 1, in which said thin film comprises a polycrystalline semiconductor thin film having regions oriented in the same direction as the film thickness.

3. A solid-state oscillator element according to claim 1, in which said polycrystalline semiconductor thin film is doped with an impurity forming a deep level in the forbidden band of said semiconductor.

4. A solid-state oscillator element according to claim 1, in which said polycrystalline semiconductor thin film comprises a polycrystalline gallium arsenide thin film of a resistivity lower than $10^5$ Ωcm. in which the ratio of the number of gallium atoms to that of arsenic atoms is in the range of from 0.2 to 3.0.

5. A solid-state oscillator element according to claim 1 further comprising a cavity resonator having said element mounted thereon.